(12) United States Patent
Dobuzinsky et al.

(10) Patent No.: US 7,514,323 B2
(45) Date of Patent: Apr. 7, 2009

(54) VERTICAL SOI TRENCH SONOS CELL

(75) Inventors: David M. Dobuzinsky, Hopewell Junction, NY (US); Herbert L. Ho, New Windsor, NY (US); Jack A. Mandelman, Flat Rock, NC (US); Yoichi Otani, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 555 days.

(21) Appl. No.: 11/164,513

(22) Filed: Nov. 28, 2005

(65) Prior Publication Data

US 2007/0122971 A1    May 31, 2007

(51) Int. Cl.
*H01L 29/00* (2006.01)
(52) U.S. Cl. .............................. 438/269; 257/E29.131; 257/330
(58) Field of Classification Search ........................ None
See application file for complete search history.

(56) References Cited

U.S. PATENT DOCUMENTS

| | | | |
|---|---|---|---|
| 5,424,569 A | 6/1995 | Prall | |
| 6,172,391 B1 * | 1/2001 | Goebel et al. | 257/305 |
| 6,352,882 B1 * | 3/2002 | Assaderaghi et al. | 438/155 |
| 6,777,737 B2 * | 8/2004 | Mandelman et al. | 257/305 |
| 6,787,419 B2 | 9/2004 | Chen et al. | |
| 7,129,130 B2 * | 10/2006 | Adkisson et al. | 438/243 |
| 7,294,543 B2 * | 11/2007 | Cheng et al. | 438/243 |
| 2007/0045697 A1 * | 3/2007 | Cheng et al. | 257/301 |
| 2008/0057647 A1 * | 3/2008 | Ho et al. | 438/259 |

OTHER PUBLICATIONS

Swift, et al., "An Embedded 90nm SONOS Nonvolatile Memory Utilizing Hot Electron Programming and Uniform Tunnel Erase," IEDM Tech. Dig., pp. 927-930, Dec. 2002.

* cited by examiner

*Primary Examiner*—Evan Pert
*Assistant Examiner*—Ben P Sandvik
(74) *Attorney, Agent, or Firm*—Scully, Scott, Murphy & Presser, P.C.; Joseph P. Abate, Esq.

(57) ABSTRACT

A semiconductor memory device in which a vertical trench semiconductor-oxide-nitride-oxide-semiconductor (SONOS) memory cell is created in a semiconductor-on-insulator (SOI) substrate is provided that allows for the integration of dense non-volatile random access memory (NVRAM) cells in SOI-based complementary metal oxide semiconductor (CMOS) technology. The trench is processed using conventional trench processing and it is processed near the beginning of the inventive method that allows for the fabrication of the memory cell to be fully separated from SOI logic processing.

9 Claims, 8 Drawing Sheets

VERTICAL SOI TRENCH SONOS CELL

FIELD OF THE INVENTION

The present invention relates to a semiconductor memory device and a method of fabricating the same. More particularly, the present invention relates to a semiconductor memory device in which a vertical trench semiconductor-oxide-nitride-oxide-semiconductor (SONOS) memory cell is created in a semiconductor-on-insulator (SOI) substrate thereby allowing for the integration of dense non-volatile random access memory (NVRAM) cells in SOI-based complementary metal oxide semiconductor (CMOS) technology. The trench is fabricated using conventional trench processing and it is formed near the beginning of the inventive method that allows for the fabrication of the memory cell to be fully separated from SOI logic processing.

BACKGROUND OF THE INVENTION

Conventional flash memory products employing floating gate technologies, where the memory state is represented by the charge stored in an insulated, but conducting layer between the control gate electrode and the device channel region, typically use programming voltages (i.e., writing and erasing) of 10V or higher. Because of the necessity of providing high voltage levels for floating gate memory operation, integration of floating gate memories with complementary metal oxide semiconductor (CMOS) is problematic. First, present CMOS power supplies ($V_{dd}$) are approaching 1V. At these low supply voltages, it is difficult to provide high voltage levels necessary for floating gate operation—even with the use of charge-pumping circuits. Presently, one is forced to provide a separate high voltage supply for floating gate memories, e.g., 3.3V, and the use of charge-pumping circuitry, in addition to a lower voltage supply source for any CMOS logic associated with the chip. For mobile applications, the high supply voltages necessary for conventional floating gate memories severely limit the battery life. Moreover, there is a severe cost penalty of integrating floating gate memories with CMOS—it is estimated that as many as nine (9) additional lithography steps may be necessary.

Randomly-accessible semiconductor-oxide-nitride-oxide-semiconductor (SONOS) are also referred to as metal-oxide-nitride-oxide-semiconductor (MONOS); note that the terms SONOS and MONOS denote basically the same type of memory cell except that polysilicon, is used as the SONOS gate conductor and a metal is used as the MONOS gate conductor) memory, is considered a viable replacement to floating gate memories due to the moderate operating voltages these memories employ, e.g., approximately 5V. In such memory cells, the memory state is represented by the charge stored in an insulator layer located between the control gate electrode and the device channel region. Depending on the programming conditions of the memory cells, it may be possible, for example, to lower the high voltage supply from 3.3V to 1.8V or even do away with the separate power supply altogether, thereby prolonging battery life. In addition, since SONOS memories typically utilize uniform tunneling for programming, reliability problems usually associated with floating gate memories, such as hot hole injection, are avoided.

However, SONOS cells are not immune to scaling concerns. The moderate voltages needed for programming put limits on the transistor design one can employ. Short-channel effects, including punch-through, can easily occur even at these voltages, if the device channel lengths are too short. Increasing channel doping concentrations to deter punch-through can lead to lower junction breakdown and destruction of any memory capability.

The scaling of SONOS memory cells has been limited to planar devices that are typically formed in bulk semiconductor substrates. The select gate and memory gate are typically formed separately and the cell sizes of these types of cells are usually large. Recently, a SONOS planar bit cell with a 0.157 $\mu m^2$ cell size designed in 90 nm groundrules has been reported. See, for example, C. T. Swift, G. L. Chindalore, K. Harber, T. S. Harp, A. Hoefler, C. M. Hong, P. A. Ingersoll, C. B. Li, E. J. Prinz, J. A. Yater; "An embedded 90 nm SONOS nonvolatile memory utilizing hot electron programming and uniform tunnel erase," *IEDM Tech. Dig.*, pp. 927-930, December 2002. Although smaller in size, the planar cell has its limits as the channel length may be more difficult to scale in the forthcoming generations. In addition, the planar SONOS memory gate must be constructed separately from any CMOS gate process. Additional four (4) masks are required above and beyond the CMOS process to create the prior art SONOS cell array. Due to the necessity of separating the SONOS memory gate from CMOS processing, integration with high-performance CMOS can become costly.

In view of the above, there is a need for providing a method to integrate SONOS cells with SOI logic. Indeed, integration of planar SONOS cells on SOI is extremely difficult the body of the planar devices are usually 'floating' and channel lengths tend to be relatively short rather than long (to avoid making fully depleted devices that are difficult to control). These imposed constraints make the fabrication of planar SONOS cells virtually impossible on SOI substrates.

Thus, it would be beneficial to NVRAM technology if there could be a way of integrating SONOS on SOI where one can take advantage of utilizing high performance SOI logic devices together with the non-volatility of the SONOS memory cell.

SUMMARY OF THE INVENTION

The present invention provides a method wherein a vertical trench SONOS cell is created in an SOI substrate thereby allowing for integration of dense NVRAM cells in SOI-based CMOS technology. In accordance with the method of the present invention, the trench in which the SONOS cell is fabricated is formed relatively early in the overall process flow. This allows the fabrication of the SONOS memory cell to be fully separated from SOI logic processing. The method of the present invention is capable of fabricating $4F^2$ SONOS cells for highest density.

In broad terms, the method of the present invention includes the steps of:

providing at least one vertical trench SONOS memory cell located within a semiconductor-on-insulator substrate that includes a buried insulating layer separating a top semiconductor layer from a bottom semiconductor layer, said vertical trench SONOS memory cell includes a source diffusion located beneath said vertical trench and a select gate channel located on exterior sidewalls of said vertical trench;

providing a Si-containing conductively filled recess within said buried insulating layer atop said vertical trench;

vertical outdiffusing dopant from said Si-containing conductively filled recess to provide top and bottom outdiffused regions, said bottom outdiffused region is in contact with said select gate channel; and forming a silicided doped region in said top semiconductor layer adjacent to and in contact with said top outdiffused region.

In addition to the method described above, the present invention also provides a non-volatile random access memory cell that comprises:

a semiconductor-on-insulator substrate comprising a top semiconductor layer and a bottom semiconductor layer that are separated from each other by a buried insulating layer; and at least one vertical trench SONOS memory cell located within said semiconductor-on-insulator substrate, said at least one vertical trench SONOS memory cell includes a source diffusion located beneath said vertical trench, a select gate channel located on one side of said vertical trench, an outdiffused/Si-containing bridge located above and in contact with said select gate channel, and a silicided doped region located adjacent to and in contact with an upper portion of said bridge, wherein said bridge is present within said top semiconductor layer, said buried insulating layer and said lower semiconductor layer.

A denser cell layout can be provided which allows for 1F spacing between isolated cells. The denser cell layout includes:

a semiconductor-on-insulator substrate comprising a top semiconductor layer and a bottom semiconductor layer that are separated from each other by a buried insulating layer;

at least one pair of vertical trench SONOS memory cells located within said semiconductor-on-insulator substrate, each vertical trench SONOS memory cell includes a source diffusion located beneath said vertical trench, a select gate channel located on one side of said vertical trench, an outdiffused/Si-containing bridge located above and in contact with said select gate channel, and a silicided doped region located adjacent to and in contact with an upper portion of said bridge, wherein said bridge is present within said top semiconductor layer, said buried insulating layer and said lower semiconductor layer; and a deep trench isolation region separating each pair of memory cells.

DETAILED DESCRIPTION OF THE INVENTION

The present invention, which describes a method for fabricating a trench SONOS cell in an SOI substrate as well as the resultant NVRAM cell fabricated using the inventive method, will now be described in greater detail by referring to the following discussion and drawings that accompany the present application. It is noted that the drawings of the present application are provided for illustrative purposes and, as such, the drawings are not drawn to scale.

It is observed that the method of the present invention to be described in greater detail hereinbelow can provide a single trench SONOS cell or a plurality of SONOS cells, i.e., a memory cell array, can also be provided. In the drawings depicting the inventive processing steps, a pair of trench SONOS cells is illustrated.

Figure 1A:
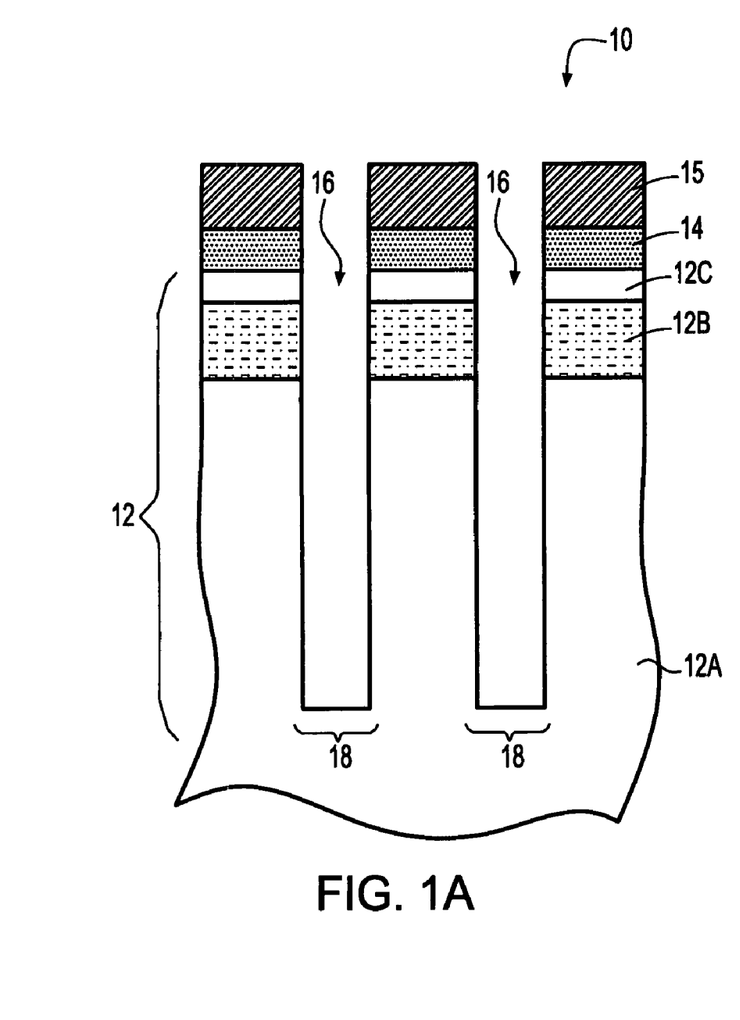
FIGS. 1A-1J are pictorial representations (through cross sectional views) illustrating the basic processing steps employed in the present invention in fabricating a pair of vertical SOI trench SONOS cells of the present invention. Each of the cross sectional views is along the bitline (BL) direction, e.g., M2, which is through the pair of memory cells illustrated in these drawings.

The inventive method for fabricating a vertical trench SONOS cell is now described in reference to FIGS. 1A-1J. Specifically, FIG. 1A illustrates an initial structure 10 which is employed in the present invention for fabricating the vertical trench SONOS cell. The initial structure 10 shown in FIG. 1A includes an array region of an SOI substrate 12 in which at least one of the inventive vertical trench SONOS cells will be fabricated. Other regions of the SOI substrate, i.e., the SOI logic region, lie to the periphery of the array region shown in this drawing. The structure 10 shown in FIG. 1A comprises the semiconductor-on-insulator substrate 12 that includes a bottom semiconductor layer 12A, a buried insulating layer 12B and a top semiconductor layer 12C. The buried insulating layer 12B provides electrical isolation between the top and bottom semiconductor layers 12C and 12A, respectively. The initial structure 10 also includes a pad stack 14 and an oxide hardmask 15 having a plurality of openings 16 on top of the SOI substrate 12 as well as trench structures 18 that are located in the SOI substrate 12. It is noted that the SOI substrate 12 in other regions can be protected with a blanket layer of the pad stack 14.

With respect to the SOI substrate 12, the top and bottom semiconductor layers (12C and 12A, respectively) thereof may comprise the same, or different semiconductor material. Preferably, the top and bottom semiconductor layers (12C and 12A, respectively) are comprised of the same semiconductor material. The term "semiconductor material" denotes any material that has semiconducting properties. Illustrative examples of semiconductor materials that can be used in the present invention include, but are not limited to: Si, SiGe, SiC, SiGeC, Ge, GaAs, InAs, InP and other II/V or III/VI compound semiconductors. Layered semiconductor materials, such as, for example, Si/SiGe, are also contemplated herein. Typically, the semiconductor layers of the SOI substrate are comprised of a Si-containing semiconductor such as, Si, SiGe, SiC or SiGeC, with Si being even more typical.

The top and bottom semiconductor layers (12C and 12A, respectively) may have the same crystal orientation, or they may have different crystal orientations. In some embodiments, the top and bottom semiconductor layers (12C and 12A, respectively) may be doped, undoped or contain undoped and doped regions therein. The top and bottom semiconductor layers (12C and 12A, respectively) may be strained, unstrained or they may each include regions of strain and unstrain therein.

The buried insulating layer 12B is comprised of a crystalline or non-crystalline oxide, nitride, or oxynitride. In a preferred embodiment, the buried insulating layer 12B is an oxide.

The SOI substrate 12 is fabricated using techniques that are well known in the art including, for example, a layer transfer process, lamination, or by ion implantation and annealing. Typically, and when ion implantation and annealing are used in forming the buried insulating layer 12B, a process known as SIMOX (Separation by Ion Implantation of Oxygen) is used.

The thickness of the various layers of the SOI substrate 12 may vary depending upon the technique that was used in forming the SOI substrate 12. Typically, the top semiconductor layer 12C has a thickness from about 5 to about 200 nm, with a thickness from about 20 to about 100 nm being even more typical. The buried insulating layer 12B typically has a thickness from about 5 to about 500 nm, with a thickness from about 50 to about 200 nm being even more typical. The thickness of the bottom semiconductor layer 12A is typically within ranges of a bulk semiconductor substrate.

The pad stack 14 is comprised of at least two material layers including a bottom pad oxide layer and an upper nitride pad layer. The individual layers of the pad stack 14 are not shown in the drawings of the present invention. The thickness of the pad stack 14 may vary depending on the number of material layers within the stack. Typically, the overall thickness for the pad stack 14 including a bottom pad oxide layer and a top pad nitride layer is from about 20 to about 500 nm. In an exemplary embodiment, the pad oxide has a thickness from about 5 to about 10 nm and the pad nitride has a thickness from about 100 to about 200 nm.

The pad stack 14 is formed on the surface of the SOI 12, i.e., the top semiconducting layer 12C, using one or more conventional blanket deposition techniques such as, for example, chemical vapor deposition (CVD), plasma enhanced chemical vapor deposition (PECVD), evaporation, chemical solution deposition or atomic layer deposition. In addition to deposition processes, the various material layers of the pad stack 14 can be formed by thermal oxidation or thermal nitridation. A combination of the aforementioned techniques can also be used.

After forming the pad stack 14 on the SOI substrate 12, an oxide hardmask 15 is formed atop the pad stack 14. The oxide hardmask 15 is formed utilizing one of the techniques described above for forming the various material layers of the pad stack 14. The thickness of the oxide hardmask 15 may vary depending on the technique that was used to form the same. A typical thickness for the oxide hardmask 15 is from about 20 to about 400 nm.

A resist having trench openings 16 (the resist is not shown in FIG. 1A) in the array region is then formed by deposition of a resist material and lithography. The lithographic step includes exposing the applied resist to a desired pattern (i.e., a trench pattern) of radiation and developing the exposed resist utilizing a conventional developer. After forming the resist having the trench openings 16, the pattern is first transferred to the oxide hardmask 15 utilizing an anisotropic etching process such as reactive ion etching, ion beam etching, plasma etching or laser ablation. The resist can be removed after the trench pattern has been transferred to the oxide hardmask 15, or it can remain on the structure during the transfer of the pattern from the hardmask 15 to the pad stack 14 and then to the SOI substrate 12 and thereafter removed, as described above. These later pattern transfer steps can be performed utilizing the same etching process as described above.

Figure 1B:
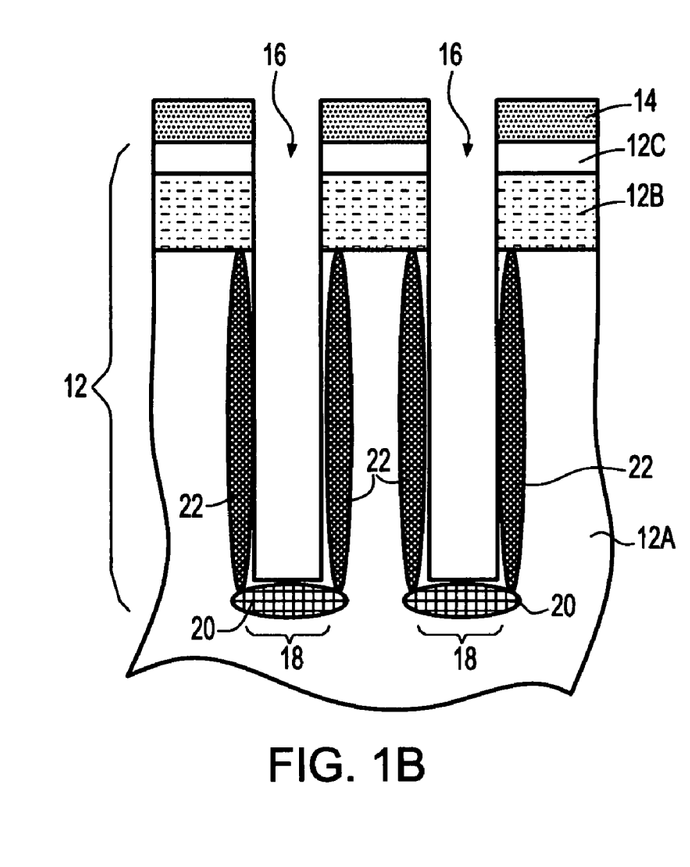

A plurality of trench structures 18 (two of which are shown in FIG. 1A), which are formed through the openings 16, having a depth, as measured from the upper surface of the SOI substrate 12, from about 1 to about 2 μm, are formed into the SOI substrate 12 in the array region. After the trench structures 18 have been formed, and if not previously removed, the oxide hardmask 15 used to define the trench structures 18 is removed utilizing a conventional stripping process that selectively removes oxide, stopping on the nitride surface of the pad stack 14. In FIG. 1B, the structure does not include the oxide hardmask 15 since it is removed prior to performing the implantations, which will be described in detail hereinbelow.

Next, the cell's source diffusion 20 and select gate channel 22 can be formed by ion implantation processes. The structure after these two implants have been performed is shown in FIG. 1B. As shown, the source diffusion 20 is formed in the SOI substrate 12, e.g., the bottom semiconductor layer 12A, about the exterior bottom wall of the trench structure 18, while the select gate channel 22 is formed into the SOI substrate 12 about the exterior sidewalls of each trench structure 18 (also within the bottom semiconductor layer 12A).

The order of the implants used in forming the source diffusion 20 and the select gate channel 22 is not critical to the present invention. Typically, however, the source diffusion implant occurs prior to the select channel implant.

The source diffusion 20 may be doped with an n-type dopant atom (i.e., an element from Group VB of the Periodic Table of Elements, such as, for example, P, Sb or As) or a p-type dopant atom (such as an element from Group IIIB of the Periodic Table Elements, such as, for example, In, B or $BF_2$). Typically, n-type dopants are used in forming the source diffusion 20. The implant energies used in forming the source diffusion 20 is typically from about 10 to about 40 keV and ion doses from about 1 E15 to about 5 E15 atoms/cm$^2$ are typically used to form a heavily doped source diffusion 20. Optionally, the sidewalls of the trench structure 18 may be protected by a masking layer, such as a nitride spacer, during the implantation of the source diffusion 20. Since the dopant concentration of the source diffusion 20 is much larger than that of the select gate channel 22, the sidewalls may need to be protected to avoid contamination of the channel by the source implant. The protective spacers are removed prior to implantation of the select gate channel 22.

The select gate channel 22 has a doping polarity that is opposite to that of the source diffusion 20. Typically, the selected gate channel 22 is doped with a p-type dopant. The select gate channel implantation is performed utilizing an angle implantation process in which a tilt angle from normal incident of about 5° to about 10° is typically employed. The channel doping required for the select gate channel 22 is dependent on the thickness of the gate dielectric to be subsequently formed in the trench structure 18 and the desired threshold voltage. An ion dose from about 1 E13 to about 1 E15 atoms/cm$^2$ is typically used for providing a range of threshold voltages (Vt) of about 0.3 to about 1.5V for a 10-15 nm gate dielectric.

Alternatively, an array doping process could be used to set the Vt of the select gate device. Typically, in standard bulk logic technologies, a triple well is usually created to define P-wells. These wells consist of a deep implant (250 to 350 keV), a medium implant (of about 150 keV) and a shallow implant (of about 50 keV).

Figure 1C:
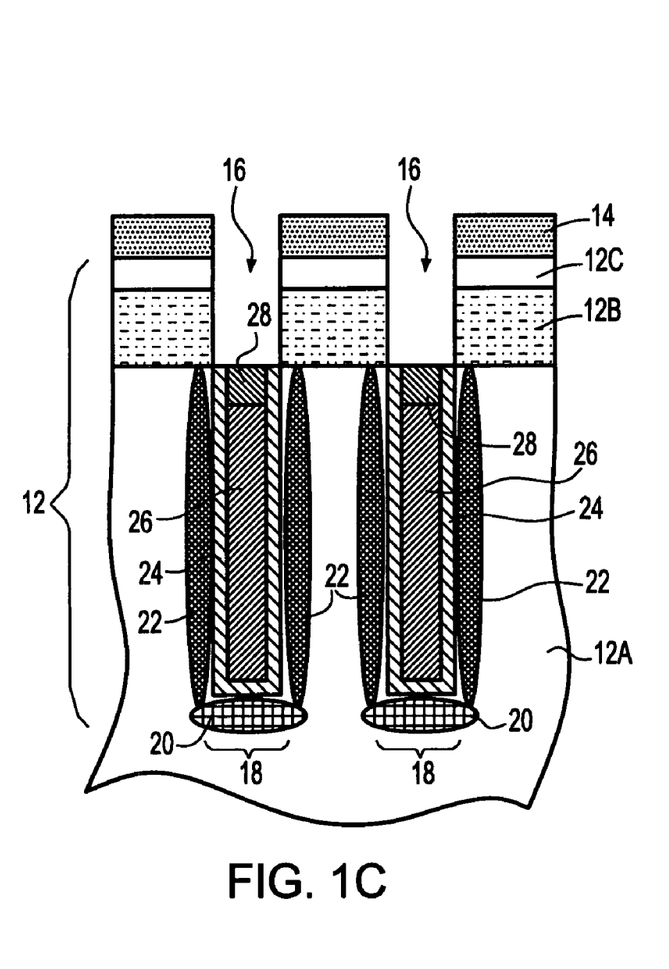

An oxide-nitride-oxide (ONO) dielectric stack 24 is then created within the trench structures 18, See, FIG. 1C. The ONO dielectric stack 24 typically consists of a bottom tunneling oxide having a thickness from about 1.2 to about 3, preferably about 2, nm, a nitride layer having a thickness from about 5 to about 15, preferably about 7.5, nm, and a top oxide having a thickness from about 2.5 to about 7.5, preferably about 5, nm. The bottom tunneling oxide can be formed utilizing a conventional deposition process such as CVD or PECVD or a thermal oxidation process can be used. The nitride layer of the ONO dielectric stack 24 is typically formed by a deposition process such, for example, PECVD or by a low pressure chemical vapor deposition (LPCVD) process. The top oxide is typically formed by a deposition process including, for example, CVD or PECVD.

Next, a SONOS array block mask (not shown) is then formed which covers the array portion of the SOI substrate 12 but leaves the trench structures 18 at the array edges (not shown) uncovered. The SONOS array block mask may comprise a conventional photoresist material that is deposited utilizing a conventional deposition process such as, for example, CVD, PECVD, or spin-on coating, and patterned via lithography. A spacer reactive ion etching process is then performed to expose the bottom of the trench structures including source diffusion 20. This allows for the fabrication of contacts to the source diffusions 20 at the array edges (not shown).

Referring back to the structure shown in FIG. 1C, a first Si-containing conductive material 26 such as, for example, polySi or polySiGe, is formed within each trench structure 18 atop the outermost layer of the ONO dielectric stack 24. Preferably, the first Si-containing conductive material 26 is polySi that is doped with the same polarity as the source diffusion 20. The first Si-containing conductive material 26 serves as the gate electrode of the memory cell, while the ONO dielectric stack 24 acts as the gate dielectric of the memory cell. The first Si-containing conductive material 26 is formed utilizing a conventional deposition process. When doped polysilicon is used as the first Si-containing conductive material 26, it is preferred that an in-situ doping deposition process be employed. Other deposition process such as CVD, PECVD, sputtering, plating, and evaporation can also be used. After forming the first Si-containing conductive material 26, the first Si-containing conductive material 26 is recessed below the buried insulating layer 12B of the SOI substrate 12. The recessing of the first Si-containing conductive material 26 is performed utilizing an anisotropic etching process such as reactive ion etching.

A second Si-containing conductive material 28, which may comprise the same or different, preferably the same, conductive material as the first Si-containing conductive material 26, is then formed utilizing one of the deposition processes mentioned above. Typically, the first and second Si-containing conductive materials 26 and 28, respectively are comprised of doped polySi. After deposition of the second Si-containing conductive material 28, the second Si-containing conductive material 28 is then recessed approximately to the bottom surface of the buried insulating layer 12B.

Next, the ONO dielectric stack 24 is removed from vertical faces of the pad stack 14, the top semiconductor layer 12C and the buried insulating layer 12B providing the structure shown in FIG. 1C. The ONO dielectric stack 24 is removed from the aforementioned vertical faces utilizing a conventional stripping process well known to those skilled in the art which selectively removes the exposed portions of the ONO dielectric stack 24.

An undercut region (not specifically labeled) located beneath the top semiconductor layer 12C is then formed laterally into the buried insulating layer 12B utilizing an etching process that selectively removes buried insulating material. For example, and when the buried insulating material is comprised of an oxide, a HF etch is employed to create the lateral undercut region within the buried insulating layer 12B. The lateral etch typically removes from about 50 to about 100 nm of the buried insulating layer 12B starting from the exposed vertical face thereof within the trench structure 18.

A third Si-containing conductive material 30, which may be the same or different, preferably the same, conductive material as the first and second Si-containing conductive materials, is then formed. Typically, the third Si-containing conductive material 30 comprises doped polySi. The third Si-containing conductive material 30 fills the lateral undercut region provided in the buried insulating layer 12B mentioned above. It is noted that it is possible that the third conducive material 30 between adjacent trench structures 18 is merged rather than separated as is shown in FIG. 1D.

The third Si-containing conductive material 30 is formed as described above and it is recessed to the bottom surface of the top semiconductor layer 12C utilizing an etching process as described above as well.

Figure 1D:
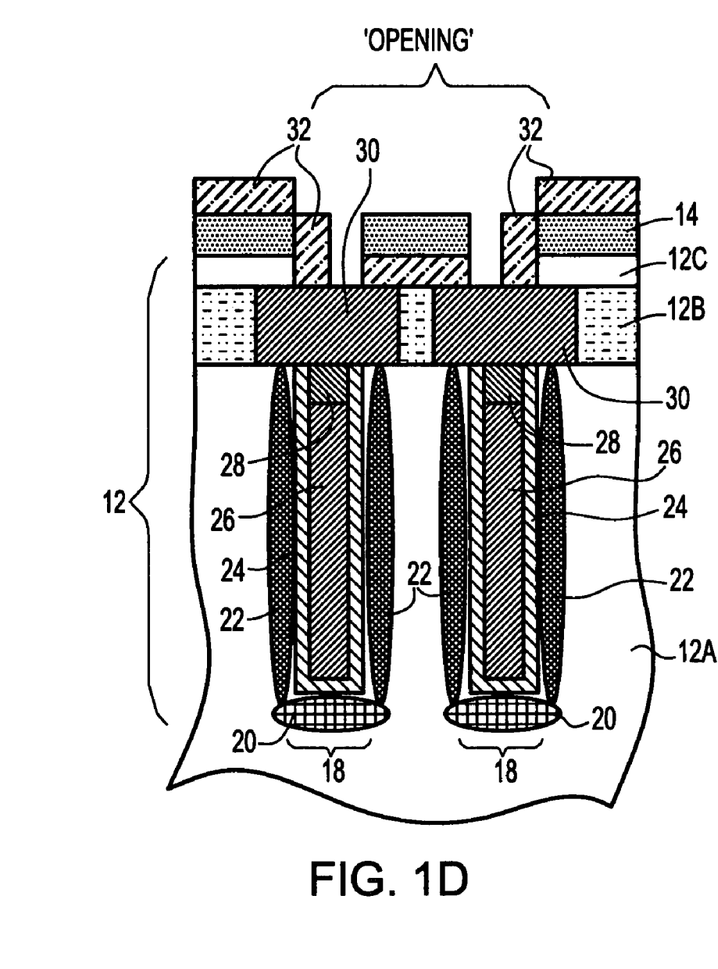

A patterned resist 32 having an opening between adjacent trench structures 18 is then formed by deposition and lithography atop the pad stack 14 providing the structure shown in FIG. 1D. Note that the pad stack 14 between the adjacent trench structures 18 is exposed, i.e., not protected by the patterned resist 32, and that some portions of the patterned resist 32 may overlap the outer edges of the each of the trench structures 18, as is shown, for example, in FIG. 1D.

The exposed portion of the pad stack 14 is then removed utilizing an etching process such as, for example, reactive ion etching. The chemistry of the etching step is dependent upon the upper material of the pack stack 14. In the preferred embodiment of the present invention in which the pad stack 14 includes an upper nitride layer, the upper nitride layer is first removed utilizing wet or dry isotropic etching. Typically hot phosphoric acid or HF/GL is used to remove a nitride layer. The remaining pad material, e.g., oxide, within the opening is then removed utilizing an etching process than selectively removes the remaining pad material. For example and when the remaining pad material includes an oxide, a fluorine containing etch can be used to remove the remaining oxide from within the opening. These steps expose the top semiconductor layer 12C within the opening.

The patterned resist 32 is then removed utilizing a conventional resist stripping process well known in the art and the exposed top semiconductor layer 12C and the third Si-containing conductive material 30 are now removed within the opening. The removal of these materials within the opening may comprise a single reactive ion etching step, useful when the exposed top semiconductor layer 12C and the third Si-containing conductive material 30 within the opening are each comprised of a Si-containing material. When a single etch is used, a $CF_4$ containing plasma is typically used. When the exposed top semiconductor layer 12C within the opening is composed of non-Si-containing materials, a two step etching process can be used in which the first etch selectively removes the top semiconductor layer 12C within the opening, and the second etch selectively removes the third Si-containing conductive material within the opening. It is noted that this etching step or steps used at this point of the present invention utilize the remaining pad stack 14 as an etch mask so that etching only occurs within the opening. Moreover, the target depth of this etching step or steps is typically greater than 2200 Å and, as a result, adjacent regions of the third Si-containing conductive material 30, which may have been merged due to a large undercut etch of buried insulating layer 12B, are now separated.

Figure 1E:
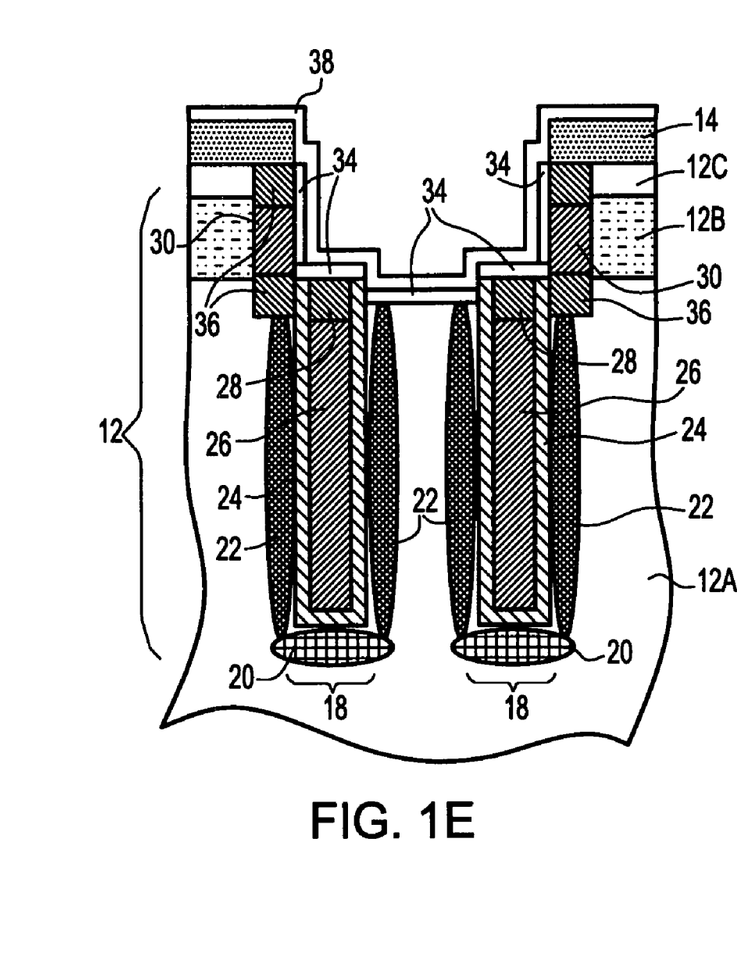

An oxidation process is then performed within the previously etched region forming an oxide liner 34 on exposed surfaces within the previously provided opening. The thickness of the oxide liner 34 formed at this point of the present invention may vary depending on the technique used in forming the same. Typically, the oxide liner 34 formed within the opening has an as deposited thickness from about 10 to about 25 nm. It is noted that during this step of the present invention, dopant material within the third Si-containing conductive material 30 outdiffuses into adjacent portions of the upper semiconductor layer 12C as well as the lower semiconductor layer 12A providing outdiffused regions 36. As is shown, outdiffused regions 36 in the lower semiconductor layer 12A are in contact with an upper portion of the channel gate 22. These outdiffused regions 36 in the lower semiconductor layer 12A form the drain of the inventive device.

Next, a nitride liner 38, which serves as an etch stop layer, is formed on the oxide liner 34 and within the opening as well as atop the exposed surface of the pad stack 14 that is located outside the opening. The nitride liner 38 is formed utilizing a conventional deposition process such as, for example, CVD or PECVD. Typically, the nitride liner 38 has a thickness from about 5 to about 25 nm, with a thickness from about 10 to about 20 nm being even more typical.

The structure including the opening, the oxide liner 34, outdiffused regions 36 and the nitride liner 38 is shown, for example, in FIG. 1E.

Figure 1F:
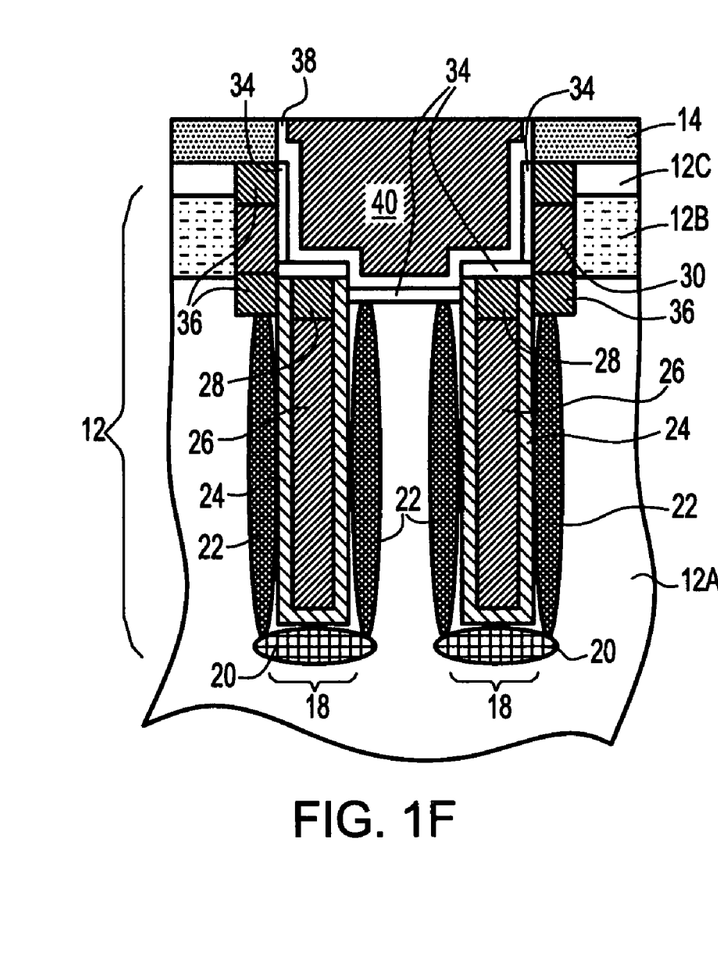

FIG. 1F shows the structure after filling the opening with an isolation trench dielectric material, annealing and planarization, which steps form a shallow trench isolation 40. This anneal step will also cause additional outdiffusion in the structure in the regions indicated above. The isolation trench dielectric employed in the present invention includes an oxide such as TEOS or a high density plasma oxide. Although oxide trench dielectric materials are specifically described and illustrated, the trench dielectric material may also include a nitride or oxynitride. Filling of the opening with a trench dielectric material includes the employment of any conventional deposition process such as, for example, CVD or PECVD. The anneal is typically performed at a temperature of about 850° C. or greater, with a temperature from about 900° to about 1000° C. being more typical. The planarization process comprises chemical mechanical polishing (CMP), grinding or a combination thereof. In the structure shown in FIG. 1F, reference numeral 40 denotes the shallow trench isolation region that includes the planarized trench fill material. By "shallow" it is meant that the trench isolation region has a depth from about 100 to about 700 nm.

Next, a deglazing step which removes oxide from the structure is performed. The deglazing step is performed utilizing conventional techniques well known in the art. This typically includes the use of HF/ethylene glycol as a deglazing agent. After deglazing, the pad stack 14 is removed from the structure utilizing a stripping process that selectively removes the pad stack 14. When the pad stack 14 comprises a nitride material, hot phosphoric acid can be used to selectively remove the nitride pad stack. In the event any divots form in the structure during the stripping of the pad stack 14, the divots (not shown) can be filled with a dielectric material such as, for example, a nitride. The divot fill is performed utilizing a conventional deposition process such as, for example, CVD or PECVD. When the pad stack 14 includes an oxide under the nitride, the oxide pad stack is removed utilizing an etching process that selectively removes oxide. For example, an HF containing etch can be used in removing the underlying pad oxide. Note that during these processing steps of the present invention, the shallow trench isolation region 40 is thinned so that an upper surface thereof is substantially coplanar with an upper surface of the top semiconductor layer 12C.

Figure 1G:
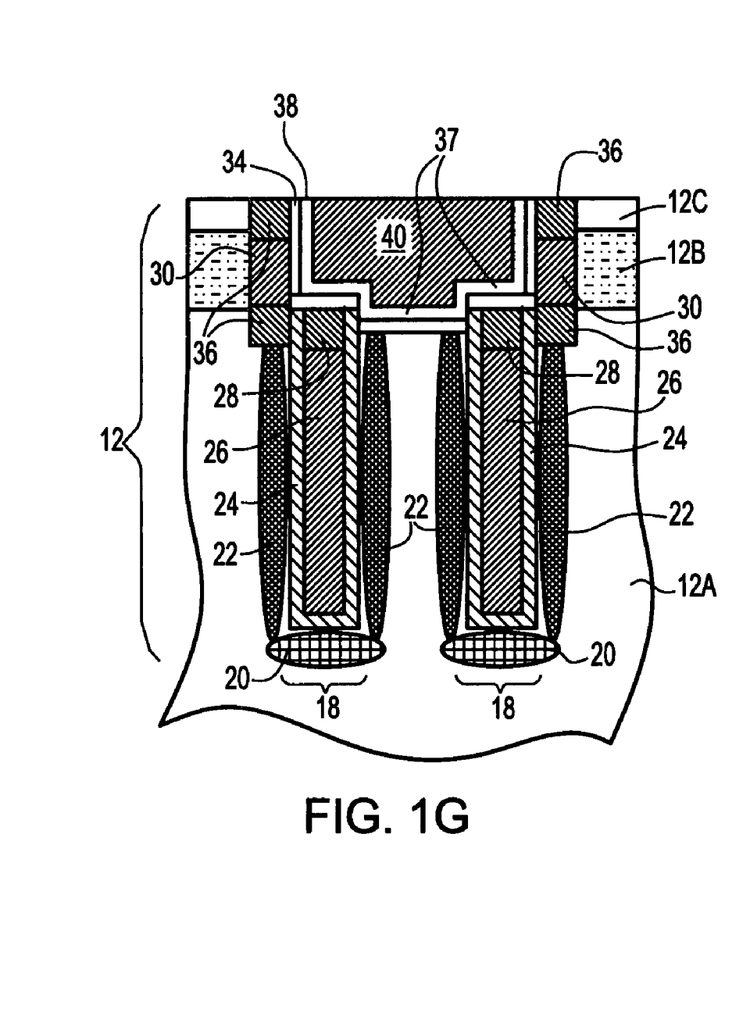

The resultant structure after deglazing and removal of the entire pad stack 14, including, for example, the nitride/oxide pad stack is shown in FIG. 1G. Note that an upper surface of the top semiconductor layer 12C is now exposed. At this point of the inventive process, an array well (n- or p-) is formed utilizing a masked ion implantation process. The implantation is performed at an energy from about 150 to about 200 keV and the dosage of implantation ions is typically from about 5 E12 to about 1 E13 atoms/cm$^2$. The conditions providing above are exemplary and in no ways limit the scope of the present invention. It is noted that the array well is not shown in the drawings of the present application, but it would be formed within the lower semiconductor layer 12A about the pair of trench structures shown.

Doped regions are now formed into exposed portions of the top semiconductor layer 12C utilizing a conventional ion implantation process that is capable of forming doped regions within a semiconductor layer. An annealing step may follow the ion implantation step. The anneal activates and drives in the dopants that were previously implanted. The doped regions may comprise an n-type dopant or a p-type dopant. It is noted that in the present invention, the doped regions, the outdiffusion regions 36, the third Si-containing conductive material 30, the second Si-containing conductive material 28, the first Si-conductive material 26 and the source diffusion 20 all have the same conductivity (n or p-type). Preferably, each of the aforementioned regions and materials is of the n-conductivity type. Note that the select gate channel 22 has the opposite conductivity than the regions and materials mentioned previously in this paragraph.

Figure 1H:
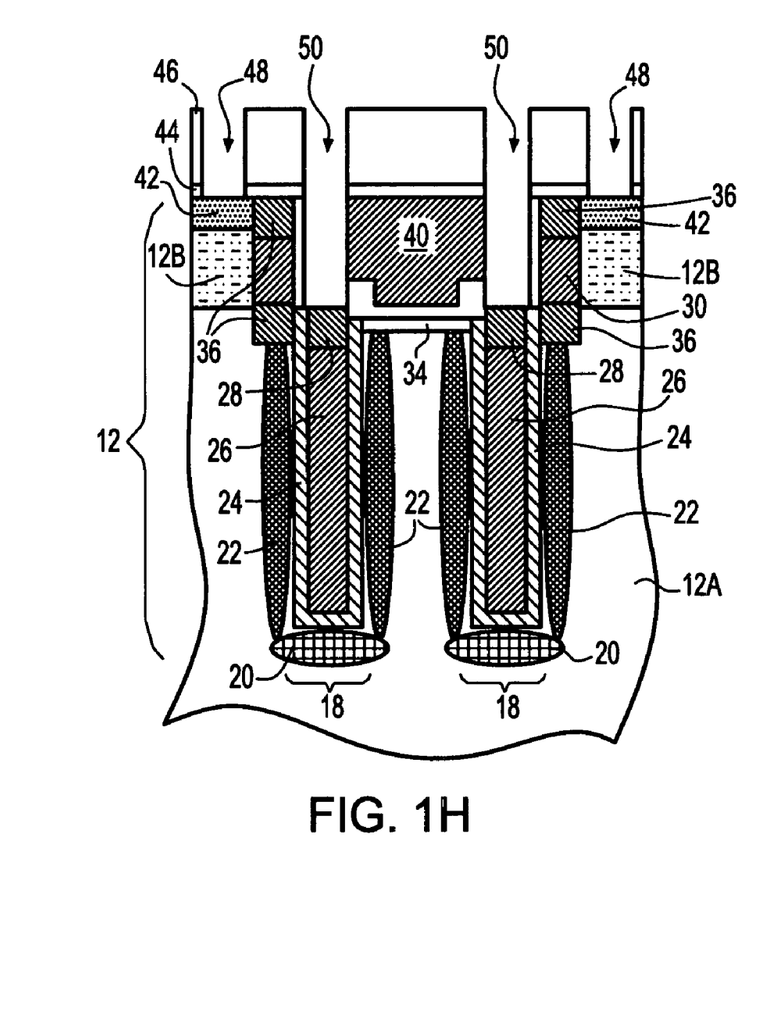

After forming the doped regions, the doped regions are silicided (see FIG. 1H, reference numeral 42). Silicidation includes applying a metal that is capable of reacting with Si on the exposed surface of the top semiconductor layer 12C. The metal used in the present invention in forming a silicide can be composed of Ti, Ta, W, Co, Ni, Pt, Pd or alloys thereof. Typically, the metal includes one of Ti, Co, Ni, Pt or alloys thereof, with Ni or Pt alloys being particularly preferred in one embodiment of the present invention. In some embodiments, a silicon layer is applied to the surface of the top semiconductor layer 12C prior to metal formation. The metal is formed utilizing a conventional deposition process such as, for example, CVD, PECVD, plating, sputtering and other like deposition processes.

The metal can also include one or more alloying additives including, for example, C, Al, Ti, V, Cr, Mn, Fe, Co, Ni, Cu, Ge, Zr, Nb, Mo, Ru, Rh, Ag, In, Sn, Hf, Ta, W, Re, Ir or Pt, with the proviso that the one of more alloying additives is not the same as the metal used in forming the silicide. When present, the one or more alloying additives is present in an amount from about 0.1 to about 50 atomic percent. The alloying additive can be added in-situ during the deposition of the metal, or it can be introduced after the metal is deposited by ion implantation, plasma immersion or gas phase doping. The thickness of the as deposited metal may vary depending upon the overall thickness of layer 12C. Typically, the thickness of the metal is from about 2 to about 20 nm, with a thickness from about 5 to about 10 nm being more typical.

In some embodiments, an oxygen diffusion barrier such as TiN or TaN is formed atop the metal prior to silicidation. The optional oxygen diffusion barrier, which is formed by a conventional deposition process, typically has a thickness from about 5 to about 50 nm.

The silicidation process includes a first anneal, removing any unreacted first and second metal from the structure together with the optional oxygen diffusion barrier, and optionally a second anneal. The first anneal is typically performed at lower temperatures than the second annealing step. Typically, the first anneal, which may or may not form a silicide in its lowest resistance phase, is performed at a temperature of about 300° C. or greater, with a temperature from about 350° to about 650° C. being even more typical. The first anneal may be performed using a continuous heating regime or various ramp and soak cycles can be used. The first anneal is typically carried out in a gas atmosphere such as, for example, He, Ar, $N_2$ or a forming gas anneal. The annealing time may vary depending on the metals or metal alloys used in forming the silicide. Typically, the annealing is performed for a time period from about 5 seconds to about 2 hours. The annealing process may be a furnace anneal, a rapid thermal anneal, a laser anneal, a spike anneal or a microwave anneal A selective wet etch process(es) can be used to remove any unreacted metal as well as the optional oxygen diffusion barrier from the structure. The second annealing step, if performed, is typically carried out at a temperature of about 550° C. or greater, with a temperature from about 600° to about 800° C. being more typical. The second anneal may be performed in the same or different gas atmosphere as the first anneal.

In FIG. 1H, reference numeral 42 is used to denote the silicided doped regions. FIG. 1H also shows the structure after forming a patterned nitride barrier 44 and a patterned interlevel dielectric 46 thereon. As shown, the patterned nitride barrier 44 and the patterned interlevel dielectric 46 have openings therein. Some of the openings expose the silicided doped regions 42. These openings are referred to as bitline contact vias and are labeled as reference numeral 48 in FIG. 1H. The other openings which expose the second Si-containing conductive material 28 are referred to as memory gate contact vias and are referenced by reference numeral 50 in FIG. 1H.

The structure shown in FIG. 1H is formed by first providing a blanket nitride barrier over the structure shown in FIG. 1G utilizing a conventional deposition process. The blanket nitride barrier typically has a thickness from about 10 to about 25 nm. Next, a blanket interlevel dielectric typically an oxide is formed over the blanket nitride barrier. The blanket interlevel dielectric is formed by a conventional deposition process (such as CVD, PECVD or spin-on coating) and it typically has a thickness from about 50 to about 300 nm. A photoresist material (not shown) is then deposited by a conventional deposition process and it is subjected to lithography (including resist exposure and development) providing a patterned resist atop the blanket layers. The pattern in the resist is then transferred to the blanket layers utilizing one or more etching process. Typically, a reactive ion etching process is used to form the openings shown in FIG. 1H. After etching, the patterned resist is stripped utilizing a conventional resist stripping process well known to those skilled in the art.

Figure 1I:
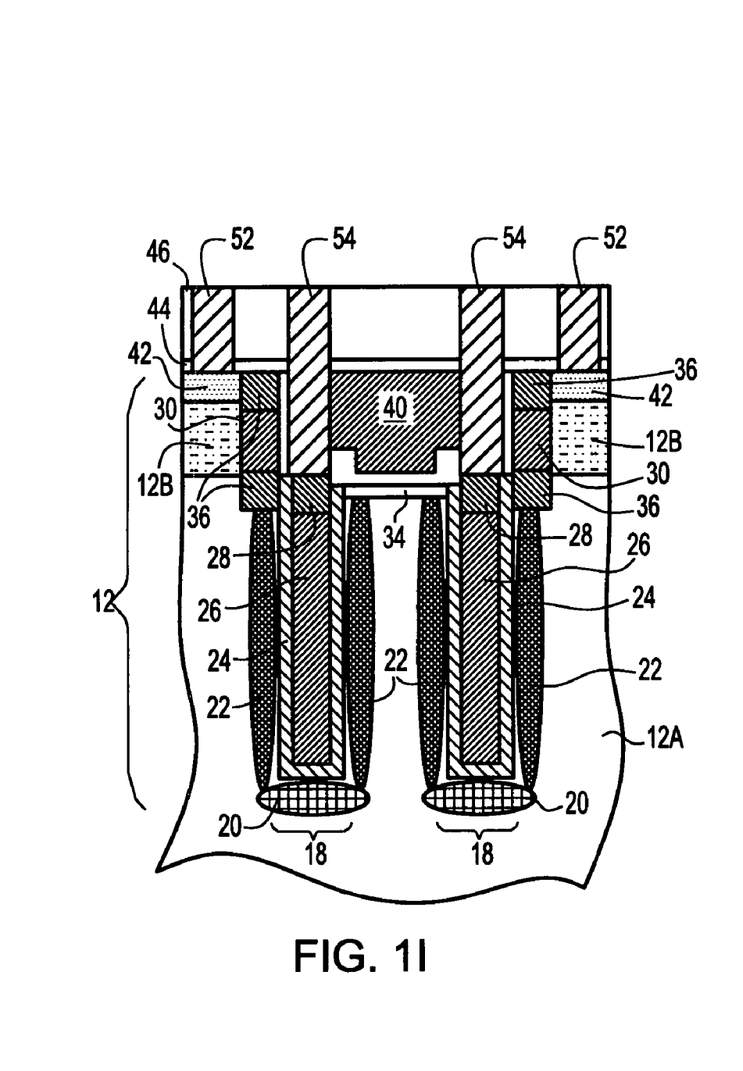

FIG. 1I shows the structure after filling the openings (48 and 50) with a conductive material and planarizing the same. The conductive material comprises polySi, polySiGe, a metal, a metal alloy, a metal silicide, a metal nitride or any combination thereof. Typically, the conductive material used in filling the openings is a metal such as, for example, Al, Cu, W, Pt, or alloys thereof, with W being highly preferred. The conductive fill includes a conventional deposition process such as CVD, PECVD, plating, and sputtering, while planarization includes chemical mechanical polishing (CMP), grinding or a combination thereof. In FIG. 1I, the conductively filled bitline contact via 48 is referred to as the bitline contact 52, while the conductively filled memory gate contact via 50 is referred to as the memory gate contact 54.

Figure 1J:
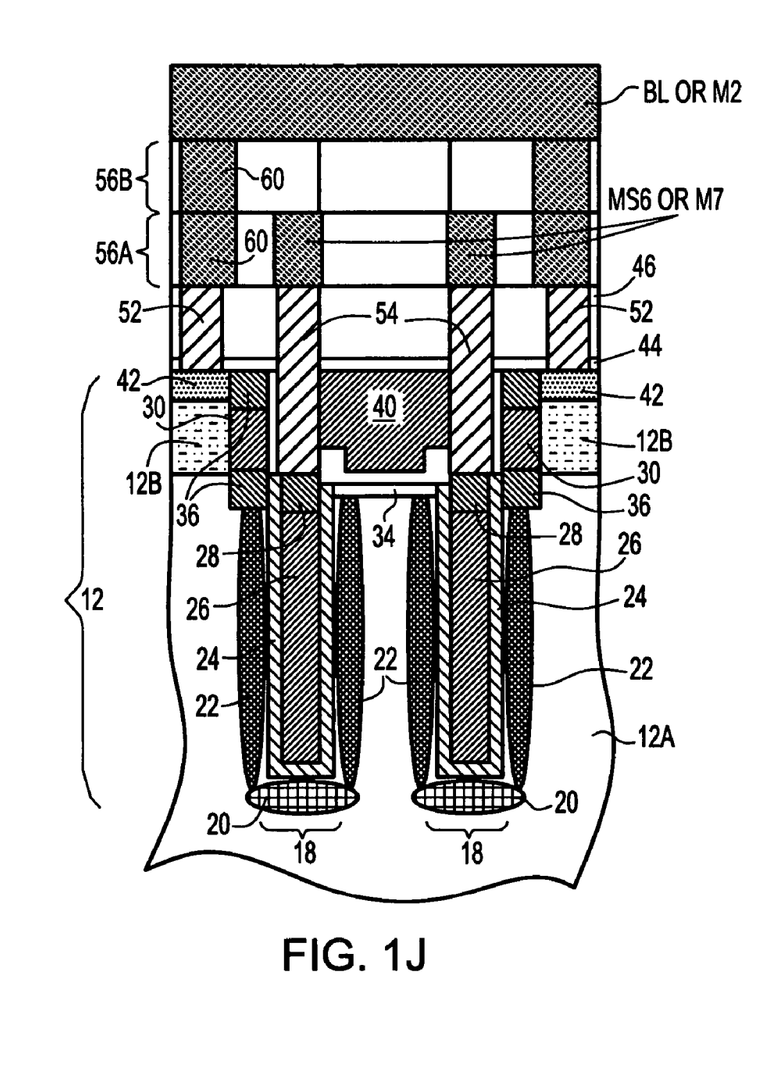

FIG. 1J shows the structure after forming additional interconnect levels 56A and 56B and bitline (BL or M2) thereon. Each of the interconnect levels comprises an interlevel dielectric 58A and 58B including conductive feature 60 located therein. The conductive features 60 and the bitline (BL or M2) may comprise the same or different conductive material as the conductively filled vias mentioned above. The conductive features atop the memory gate contacts 54 are labeled as MI or MSG in the drawing.

Figure 2:
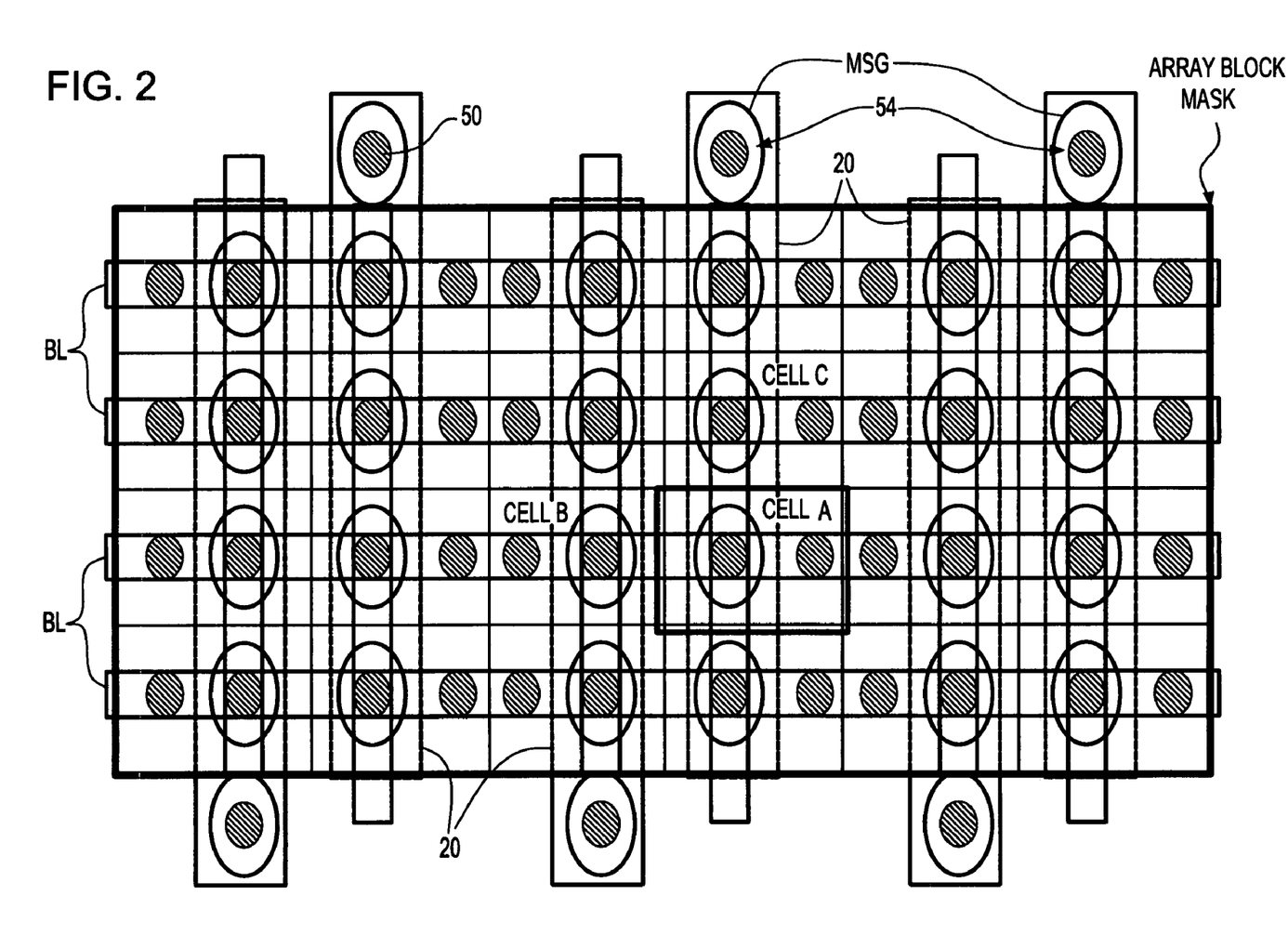
FIG. 2 is a pictorial representation (through a top down view) illustrating a cell array layout including a plurality of SOI trench SONOS cells, a pair of which is shown, for example, in FIG. 1J.

FIG. 2 is a top down view illustrating a memory array which includes a plurality of trench SONOS cells as depicted in FIG. 1J. In this drawing, cells A, B and C are specifically illustrated and are used in describing the basic operation of the memory array. Electrical operations that may be performed on individual memory cells in the memory array depicted in FIG. 2 will now be described. The basic programming operations of a SONOS cell are a) Write "0", b) Write "1"/Erase "0", c) Read "1" or Read "0". These operations will now be described by referring to FIG. 2 which is a schematic showing a proposed SONOS cell array including Cells A-C.

Electrical operations that may be performed on each memory cell in an array will now be described. The basic programming operations are a) Write "0", b) Write "1"/Erase and c) Read "1" or "0".

a) Write "0": To write a "0" into Cell A, the bitline (BL) is biased at −5V, the memory select gate (MSG) is boosted to 5V and the array Pwell is biased to −5V. With these conditions, electrons are driven by the high field between the inversion layer of the memory cell and the memory select gate and they are trapped in the ONO of the memory cell portion of the trench. There is negligible current through the channels of the select and memory transistors because the bitline and the deep trench source line are both at −5V. Inhibit cells sharing the same boosted MSG (cell C) will not be programmed since they see a low field between the bitline diffusion and memory select gate. Bitline current from cell C is relatively small because the Pwell is biased at −5V. Additionally, inhibit cells sharing the same bitline (cell B), as the programmed cell will not be written because their memory select gates are at −5V. With electron injection into the ONO, the threshold voltage of the memory device should increase considerably and should significantly reduce current when being read.

b) Write "1" (or Erase "0"): To write a "1" into cell A, the BL and the deep trench source line are biased to +5V. The memory select gate is biased to −5V, and the array Pwell is biased +5V. With these biasing conditions in the selected cells, hole injection into the ONO is dominant while trapped electrons are injected back into the bitline diffusion of the memory device by the high field between memory gate and bitline diffusion. All cells sharing the same memory gate select line (e.g., Cell C, memory gate select line 1) undergo the write "1"/erase operation. Once all the same memory gate line are written "1"/erase, write "0" is performed selectively to produce the desired bitline pattern. Inhibit cell B is not erased, nor does channel current flow, since its MSG, BL and deep trench source line are all at +5V.

c) Read: To read a "1" or "0" from cell A shown in FIG. 11, the BL is biased at a lower voltage (e.g., 1.5V) and the memory select gate is boosted to +1.5V. The array well and the deep trench source line are grounded. If no current is detected, this means that the threshold voltage if the memory device is too high to turn on and, hence, a "0" has been written into the cell. If current is detected, this means that the threshold voltage of the memory device is low (and quite likely negative) and the device is on; therefore, a "1" has been written into the cell (i.e., a depletion mode planar memory device). Neighboring inhibit cells can be grounded or even biased slightly negative to present the gate from being turned on.

Figure 3A:
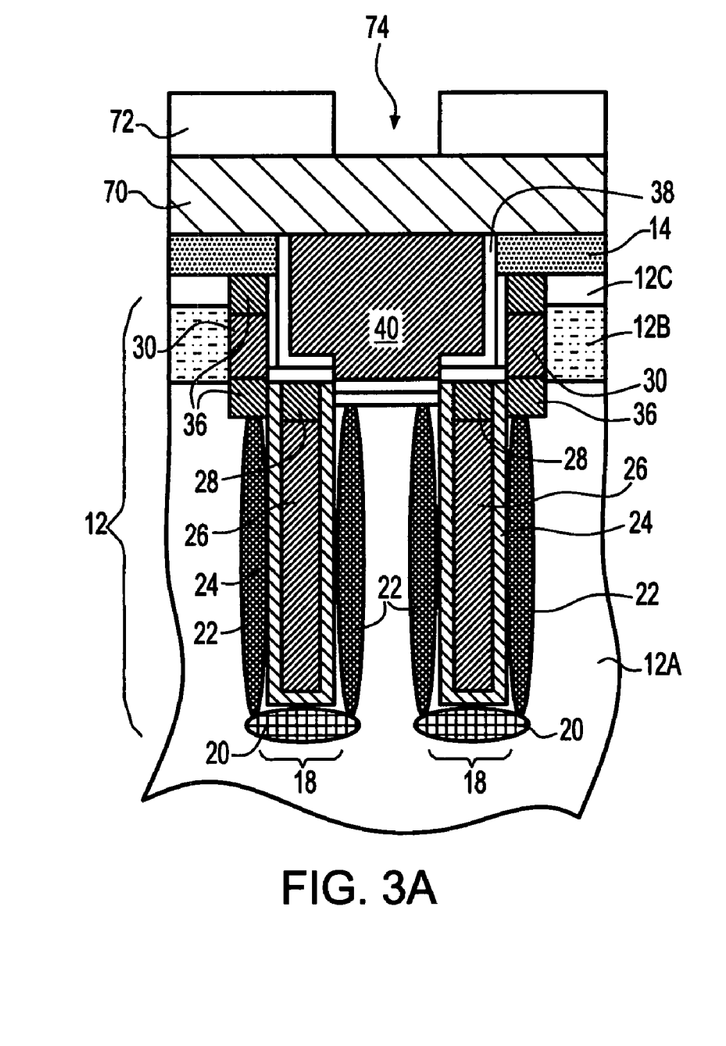
FIGS. 3A-3C are pictorial representations (through cross sectional views) illustrating the processing flow used in the present invention for fabricating a 4F$^2$ vertical SOI SONOS cell; these cross sectional views are also along the BL direction.
Figure 3B:
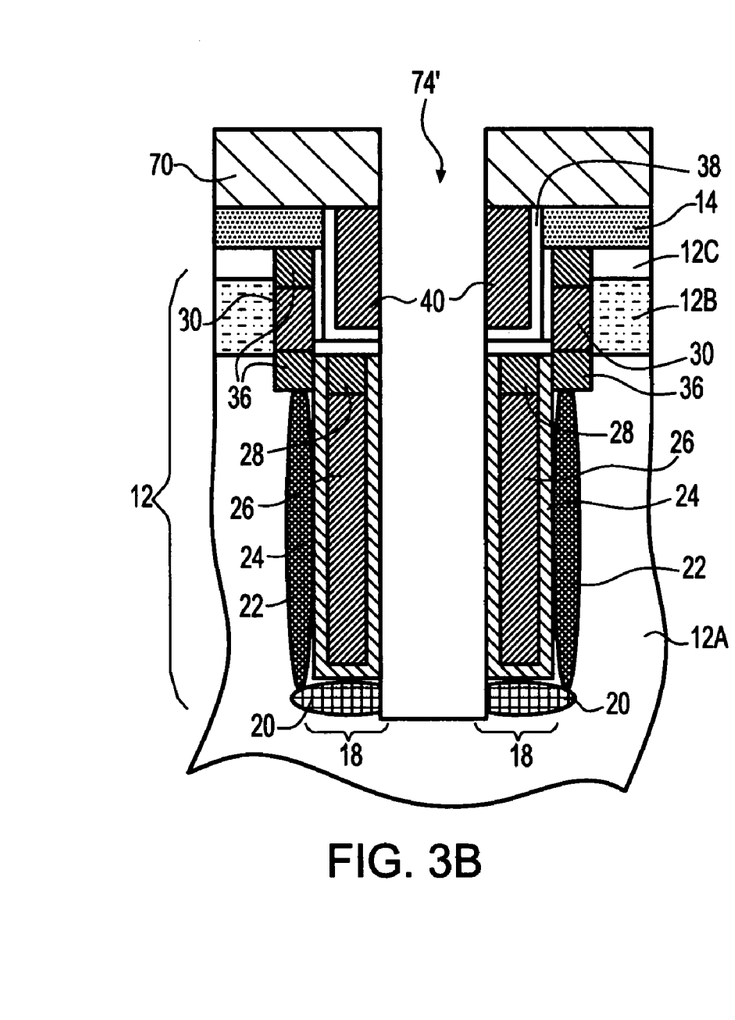
Figure 3C:
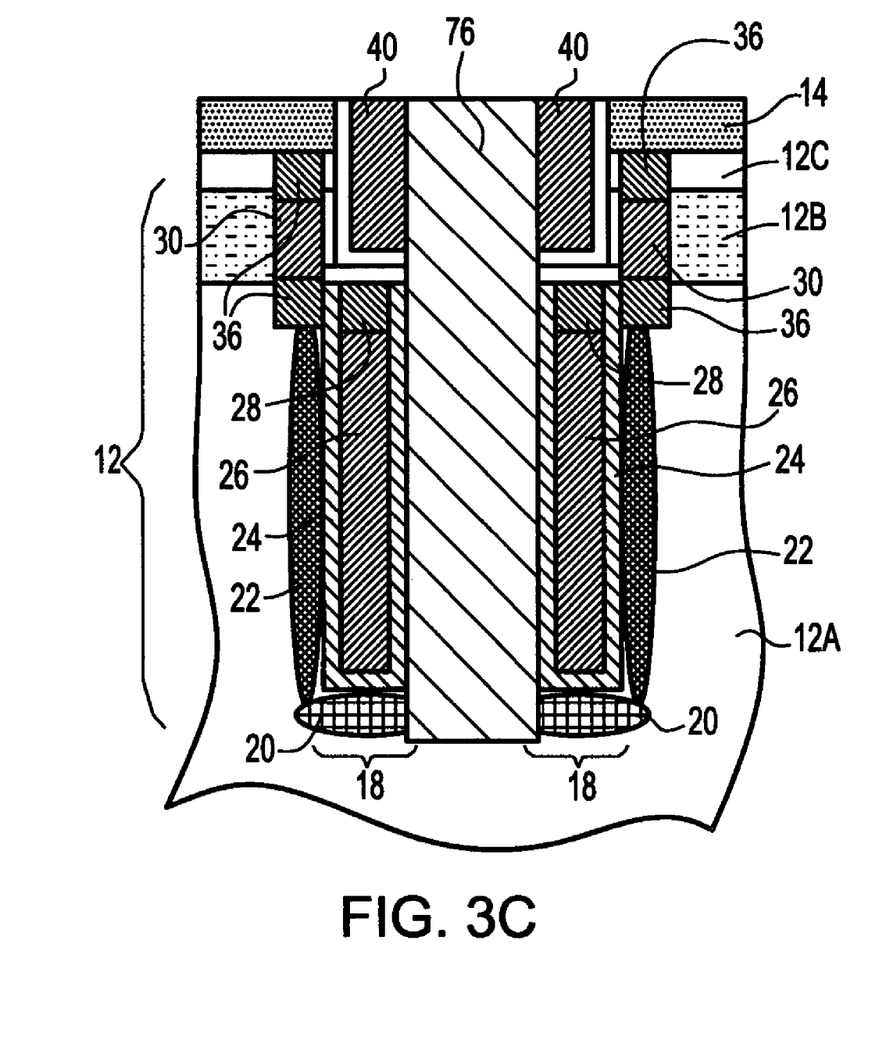

In some embodiments of the present invention, a $4F^2$ SOI SONOS cell is created that allows 1F spacing between adjacent isolated cells. Such a cell and process for fabricating the same are depicted in FIGS. 3A-3C. It is noted that this embodiment of the present invention utilizes the same basic processing steps used in forming the structure shown in FIG. 1F. After providing the structure shown in FIG. 1F, an oxide hardmask 70 is deposited on the structure utilizing a conventional deposition process. Typically, the oxide hardmask 70 is comprised of a doped silicate glass such as boron doped silicate glass. The oxide hardmask 70 has a thickness from about 100 to about 300 nm. A patterned resist 72 is then formed atop the oxide hardmask 70 utilizing a conventional deposition technique and lithography. The patterned resist 72 includes an opening 74 that is positioned above the shallow trench isolation region 40 separating adjacent cells. The resultants structure including the oxide hardmask 70 and the patterned resist 72 is shown, for example, in FIG. 3A.

FIG. 3B shows the structure after etching through the opening 74 in the patterned resist 72 stopping within the lower semiconductor layer 12A at a distance that is below that lower surface of the source region 20. This etching process includes reactive ion etching through the oxide hardmask 70 and the shallow trench isolation region 40; then etching through liners 38 and 34, and finally reactive ion etching through lower semiconductor layer 12A to a depth that is greater than the source diffusion 20. Typically, a reactive ion etching step is used in forming the structure shown in FIG. 3B. In FIG. 3B, reference numeral 74' denotes the deep opening provided in the structure.

Next, and as shown in FIG. 3C, a flowable oxide such as a spin-on glass is formed within the deepen opening 74' utilizing a conventional deposition process. After filling the deepen opening 74' with the flowable oxide, the flowable oxide is planarized using the pad stack 14 as an etch/polish stop layer. The planarized flowable oxide within the deepen opening 74' forms a deep trench isolation region 76 between adjacent memory cells. The processing as described in FIGS. 1G-1J is the preformed as described above.

It is noted that the vertical SONOS memory cell depicted in either FIGS. 1A-1J or FIGS. 3A-3C includes a semiconductor-on-insulator substrate 12 comprising a top semiconductor layer 12C and a bottom semiconductor layer 12A that are separated from each other by a buried insulating layer 12B and at least one vertical trench SONOS memory cell located within said semiconductor-on-insulator substrate. The at least one vertical trench SONOS memory cell includes a source diffusion 20 located beneath a vertical trench 18, a select gate channel 22 located on one side of said vertical trench, an outdiffused/Si-containing bridge (comprised of regions 36 and 30) located above and in contact with said select gate channel 22, and a silicided doped region 42 located adjacent to and in contact with an upper portion of said bridge, i.e., regions 36 and 30. In accordance with the present invention, the 'bridge' present within said top semiconductor layer 12C, said buried insulating layer 12B and said lower semiconductor layer 12A.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing at least one vertical trench SONOS memory cell located within a semiconductor-on-insulator substrate that includes a buried insulating layer separating a top semiconductor layer from a bottom semiconductor layer, said vertical trench SONOS memory cell includes a source diffusion located beneath said vertical trench and a select gate channel located on exterior sidewalls of said vertical trench;
   providing a Si-containing conductively filled recess within said buried insulating layer atop said vertical trench;
   vertical outdiffusing dopant from said Si-containing conductively filled recess to provide top and bottom outdiffused regions, said bottom outdiffused region is in contact with said select gate channel; and
   forming a silicided doped region in said top semiconductor layer adjacent to and in contact with said top outdiffused region.

2. The method of claim 1 wherein said source diffusion is formed by ion implantation and said select channel is formed utilizing an angle ion implant process.

3. The method of claim 1 providing a Si-containing conductively filled recess within said buried insulating layer by utilizing a lateral etching step that selectively removes the buried insulating layer and filling with a Si-containing conductive material.

4. The method of claim 1 wherein said outdiffusion occurs during formation of a shallow trench isolation region.

5. The method of claim 4 further comprising forming a deep trench isolation region between neighboring pairs of vertical trench memory cell, said deep trench isolation splitting the shallow trench isolation region.

6. The method of claim 1 further comprising forming a bitline contact located above and in contact with said doped silicide region.

7. The method of claim 1 further comprising forming a memory gate contact located above and in contact with said at least one vertical trench memory cell.

8. The method of claim 6 further comprising forming a bitline located above and in contact with said bitline contact.

9. The method of claim 7 further comprising forming a conductive feature embedded within an interlevel dielectric located above and in contact with said memory gate contact.

* * * * *